US012751245B2

(12) United States Patent
Smith et al.

(10) Patent No.: US 12,751,245 B2
(45) **Date of Patent: *Sep. 29, 2026**

(54) PURGE FLOW DISTRIBUTION SYSTEM FOR A SUBSTRATE CONTAINER AND METHOD FOR PERFORMING THE SAME

(71) Applicant: ENTEGRIS, INC., Billerica, MA (US)

(72) Inventors: Mark V. Smith, Colorado Springs, CO (US); Thomas H. Wilkie, Colorado Springs, CO (US); Colton J. Harr, Monument, CO (US); Matthew A. Fuller, Colorado Springs, CO (US); Shawn D. Eggum, Lonsdale, MN (US); Michael C. Zabka, New Prague, MN (US)

(73) Assignee: Entegris, Inc., Billerica, MA (US)

( * ) Notice: Subject to any disclaimer, the term of this patent is extended or adjusted under 35 U.S.C. 154(b) by 585 days.

This patent is subject to a terminal disclaimer.

(21) Appl. No.: 17/973,309

(22) Filed: Oct. 25, 2022

(65) Prior Publication Data

US 2023/0128154 A1 Apr. 27, 2023

Related U.S. Application Data

(60) Provisional application No. 63/272,282, filed on Oct. 27, 2021.

(51) Int. Cl.
*H01L 21/673* (2006.01)
*H10P 72/10* (2026.01)

(52) U.S. Cl.
CPC .......... *H10P 72/1926* (2026.01); *H10P 72/14* (2026.01)

(58) Field of Classification Search
CPC ........... H01L 21/67393; H01L 21/6732; H01L 21/37379; H01L 21/37028; H01L 21/67017; H01L 21/67207; H01L 21/67389; H01L 21/67386; H01L 21/67397; H10P 72/1922; H10P 72/1912;
(Continued)

(56) References Cited

U.S. PATENT DOCUMENTS

| | | | |
|---|---|---|---|
| 8,783,463 | B2 | 7/2014 | Watson |
| 10,847,395 | B2 | 11/2020 | Woo et al. |

(Continued)

FOREIGN PATENT DOCUMENTS

| | | | |
|---|---|---|---|
| JP | H0735396 | B2 | 4/1995 |
| JP | 2012114133 | A | 6/2012 |

(Continued)

*Primary Examiner* — King M Chu

(57) ABSTRACT

A substrate container includes a shell defining an interior space and a purge flow distribution system. The shell includes a front opening, a bottom wall, and a rear wall. The purge flow distribution system receives a stream of purge gas and includes an inlet and a network of separate gas distributing devices configured to distribute the stream of purge gas into the interior space. A supply line is also included that is connected to the inlet and configured to divide the supply of purge gas to the network of separate gas distributing devices. A method of purging an open substrate container includes supplying a stream of purge gas to an inlet of a purge flow distribution system and dividing the purge gas to supply a network of separate gas distributing devices to distribute the stream of purge gas into the interior space.

17 Claims, 9 Drawing Sheets

(58) Field of Classification Search
CPC ............. H10P 72/1921; H10P 72/1902; H10P 72/1916; H10P 72/1906; H10P 72/14; H10P 72/15; H10P 72/3406; H10P 72/1926; H10P 72/1924; H10P 72/0402; H10P 72/3404; H10P 72/1918; H10P 72/3408
USPC .......................................... 206/710, 711, 454
See application file for complete search history.

(56) References Cited

U.S. PATENT DOCUMENTS

| | | | |
|---|---|---|---|
| 10,964,570 B2 | 3/2021 | Lee et al. | |
| 2004/0182472 A1* | 9/2004 | Aggarwal ......... | H01L 21/67393 141/98 |
| 2013/0121851 A1* | 5/2013 | Kim .................. | H01L 21/67393 417/65 |
| 2018/0308733 A1 | 10/2018 | Kasama | |
| 2019/0176581 A1 | 6/2019 | Abe | |
| 2020/0066562 A1* | 2/2020 | Son ..................... | H01L 21/6732 |
| 2021/0013076 A1 | 1/2021 | Chiu | |
| 2021/0280446 A1 | 9/2021 | Fuller et al. | |
| 2021/0289446 A1 | 9/2021 | Davydov et al. | |
| 2023/0054753 A1 | 2/2023 | Chiu et al. | |

FOREIGN PATENT DOCUMENTS

| | | | |
|---|---|---|---|
| JP | 2013179287 | A | 9/2013 |
| JP | 2015170752 | A | 9/2015 |
| JP | 2018098358 | A | 6/2018 |
| JP | 2021136386 | A | 9/2021 |
| JP | 2021150353 | A | 9/2021 |
| KR | 20160014169 | A | 2/2016 |
| KR | 101684431 | B1 | 12/2016 |
| KR | 101954671 | B1 | 3/2019 |
| KR | 102190920 | B1 | 12/2020 |
| KR | 20210055483 | A | 5/2021 |
| TW | 190615 | B | 9/1992 |
| TW | 1404821 | B | 7/2005 |
| TW | 201802006 | A | 1/2018 |
| WO | 2018008879 | A1 | 1/2018 |
| WO | 2018047541 | A1 | 3/2018 |

* cited by examiner

PURGE FLOW DISTRIBUTION SYSTEM FOR A SUBSTRATE CONTAINER AND METHOD FOR PERFORMING THE SAME

FIELD

This disclosure generally relates to a substrate container with a front opening for processing semiconductor devices. More specifically, this disclosure relates to a purge gas distribution system for distributing purge gas to the interior of the substrate container and method for performing the same.

BACKGROUND

Substrates in the form of wafers can be processed to form semiconductor devices. The wafer substrates, or simply substrates, undergo a series of process steps. Exemplary process steps can include, but are not limited to, material layer deposition, doping, etching, or chemically or physically reacting material(s) of the substrate. A substrate container is used to store and transport the in-process wafers between process steps within the fabrication facility. During some process steps, the substrates are processed by processing equipment within a clean environment (e.g., a clean room). During processing, gasses must be introduced and removed from the substrate container such as a front opening unified pods (FOUP), for example during purge processes, thus requiring that the FOUP have one or more locations at which gas may enter or leave the FOUP. Substrates can be transferred from the substrate container to the processing tool through an equipment front end module (EFEM). The EFEM generally includes a load port for receiving the substrate container, a transfer unit, a frame or "mini-environment", and a fan filter unit used to generate gas flow within the EFEM.

In use, the substrate container is docked on a load port, and the door of the EFEM is opened. Next, the door is disengaged from the substrate container which permits the transfer unit housed within the EFEM to access the substrates contained within the substrate container for processing. A flow of gas introduced by the fan filter unit flows through the EFEM in a direction from a top of the EFEM to a bottom of the EFEM. When the front opening of the substrate container interfaces with the load port opening of the EFEM some of the gas flowing through the EFEM and across the load port opening may be inadvertently directed into the interior of the container, potentially interfering with the purging capabilities of the substrate container by temporarily causing an increase in the relative humidity and/or oxygen levels within the microenvironment of substrate container, which can be undesirable.

SUMMARY

This disclosure is directed to a system for distributing purge gas for wafer or reticle carrying containers such as FOUPs or pods (e.g., reticle pods) that are used, for example, in semiconductor manufacturing. More specifically, this disclosure is directed to a purge flow distribution system within a FOUP or reticle pod for distributing the stream of purge gas into the interior space of the substrate container by dividing the stream of purge gas from a common input port to a plurality of discrete input purge ports for supplying a network of separate gas distributing devices.

In at least one example embodiment, a substrate container includes a shell defining an interior space, in which the shell includes a front opening, a first side wall, a second side wall, a rear wall, and a bottom wall including a front edge extending between the first side wall and the second side wall along the front opening of the shell. The substrate container also includes a purge flow distribution system configured to receive a stream of purge gas, in which the purge flow distribution system includes an inlet configured to receive the stream of purge gas and a network of separate gas distributing devices configured to distribute the stream of purge gas into the interior space. The purge flow distribution system further includes a supply line connected to the inlet that is configured to divide the stream of purge gas to the network of separate gas distributing devices. In accordance with at least one example embodiment, the supply line includes a first flow path to one of the network of separate gas distributing devices and a second flow path to another of the network of separate gas distributing devices. In an embodiment, one of the network of gas distributing devices is a first gas distributing device provided nearer the rear wall and the another of the network of gas distributing devices is a second gas distributing device, in which the second gas distributing device can be provided nearer the front opening, and wherein the first flow path is configured to supply a portion of the stream of purge gas to the first gas distributing device and the second flow path is configured to supply another portion of the stream of purge gas to the second gas distributing device. It is appreciated that the second gas distributing device can also be provided at other locations within the interior of the substrate container, e.g., provided at the rear or adjacent another gas distributing device, and is not limited to the above embodiment. In accordance with at least one other example embodiment, the purge flow distribution system further includes a manifold base provided on the bottom wall that receives the stream of purge gas from the inlet to divide the stream of purge gas to the network of gas distributing device, in which the manifold base can be configured to divide the second flow path into at least a left side second flow path and a right side second flow path to supply the portion of the stream of purge gas to the second gas distributing device.

In at least one example embodiment, a method of purging a substrate container when having a front opening that is open that includes supplying, via an inlet port disposed in a wall of the substrate container, a stream of purge gas to an inlet of a purge flow distribution system disposed at least partly within the substrate container; and dividing, via a supply line of the purge flow distribution system, the purge gas to supply a network of separate gas distributing devices for distributing the stream of purge gas into an interior space of the substrate container, in which the supply line comprises at least a first flow path to one of the network of gas distributing devices and at least a second flow path to another of the network of separate gas distributing devices. In an embodiment, the method further includes setting a first portion of the stream of purge gas to a first gas distributing device via the first flow path and setting a second portion of the stream of purge gas to a second gas distributing device via the second flow path.

BRIEF DESCRIPTION OF THE DRAWINGS

Both described and other features, aspects, and advantages of a substrate container and a method of purging a substrate container will be better understood with the following drawings.

Figure 1:
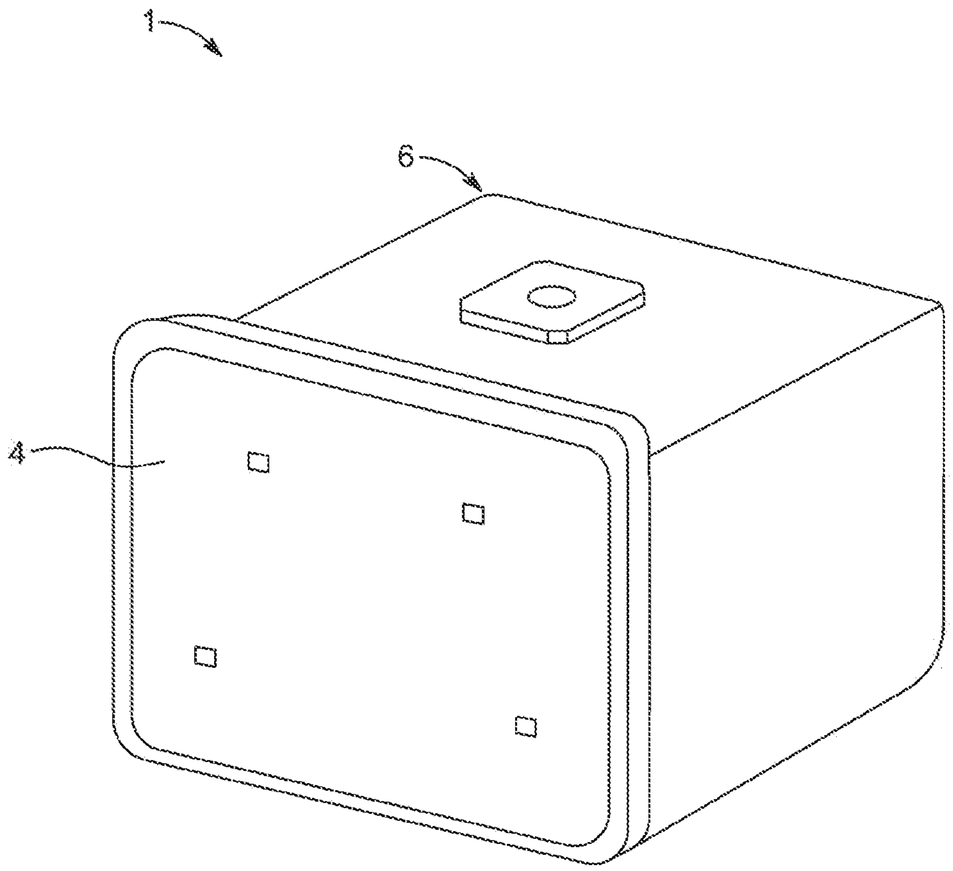
FIG. 1 is a front prospective view of a substrate container, according to at least one example embodiment.

While the disclosure is amenable to various modifications and alternative forms, specifics thereof have been shown by way of example in the drawings and will be described in detail. It should be understood, however, that the intention is not to limit aspects of the disclosure to the particular illustrative embodiments described. On the contrary, the intention is to cover all modifications, equivalents, and alternatives falling within the spirit and scope of the disclosure.

DETAILED DESCRIPTION

When used herein the term “network of gas distributing devices” means a network that includes a plurality of separate and distinct gas distributing devices that are connected together by at least one supply line. The term “gas distributing device” means a device that includes at least one gas distributing surface, and is the combination of any plurality of the gas distributing surface(s) that are provided at certain specific locations in the substrate container, e.g., a front gas distributing device includes all of the gas distributing surfaces provided at the front of the substrate container. The term “gas distributing surface” means the structural part of the gas distributing device that distributes a portion of the purge gas from the gas distributing device into the interior space, in which the gas distributing device can include multiple gas distributing surfaces. The term “supply line” means the piping, tubing, plumbing that is connected to the inlet port that receives the purge gas and is used to divide and supply the purge gas to the input purge port(s) for the gas distributing device(s) and/or gas distributing surface (s). That is, the supply line can be used to supply purge gas to a single input purge port for the gas distributing device/gas distributing surface or used to supply purge gas along multiple input purge ports for the gas distributing device/gas distributing surface. The term “pipe” or “piping” means structures that are used for distributing the flow of purge gas through the network of gas distributing devices and includes pipes, piping, tubing, pathways, connectors, valves, controllers, and similar structures that can be used for setting/adjusting the flow of gas through the network of gas distributing devices.

Also when used herein, while the terms “front” and “rear” and “right” and “left” are used to describe various elements, the elements are not limited by these terms. Rather, the terms are only used to distinguish one element from another. Instead, the terms are interpreted broadly to include any positional relationship between the elements including, the front, the back, the sides, the top, the bottom, or any combination thereof without departing from the scope of the present disclosure.

As used in this specification and the appended claims, the singular forms “a”, “an”, and “the” include plural referents unless the content clearly dictates otherwise. As used in this specification and the appended claims, the term “or” is generally employed in its sense including “and/or” unless the content clearly dictates otherwise.

The following detailed description should be read with reference to the drawings in which similar elements in different drawings are numbered the same. The detailed description and the drawings, which are not necessarily to scale, depict illustrative embodiments and are not intended to limit the scope of the invention. The illustrative embodiments depicted are intended only as exemplary. Selected features of any illustrative embodiment may be incorporated into an additional embodiment unless clearly stated to the contrary.

This disclosure generally relates to a purge flow distribution system for a substrate container having a front opening for accessing an interior space of the substrate container. More specifically, this disclosure relates to a purge flow distribution system configured to distribute a stream of purge gas into an interior space of the substrate container by dividing the stream of purge gas from a common source to a plurality of discrete input purge ports for supplying a network of separate gas distributing devices. In some embodiments, the purge flow distribution system may be configured to prevent ingress of gas into the front opening of the substrate container while open or as an outlet to facilitate the exhaustion of purge gas from the substrate container when the substrate container is closed.

Figure 2:
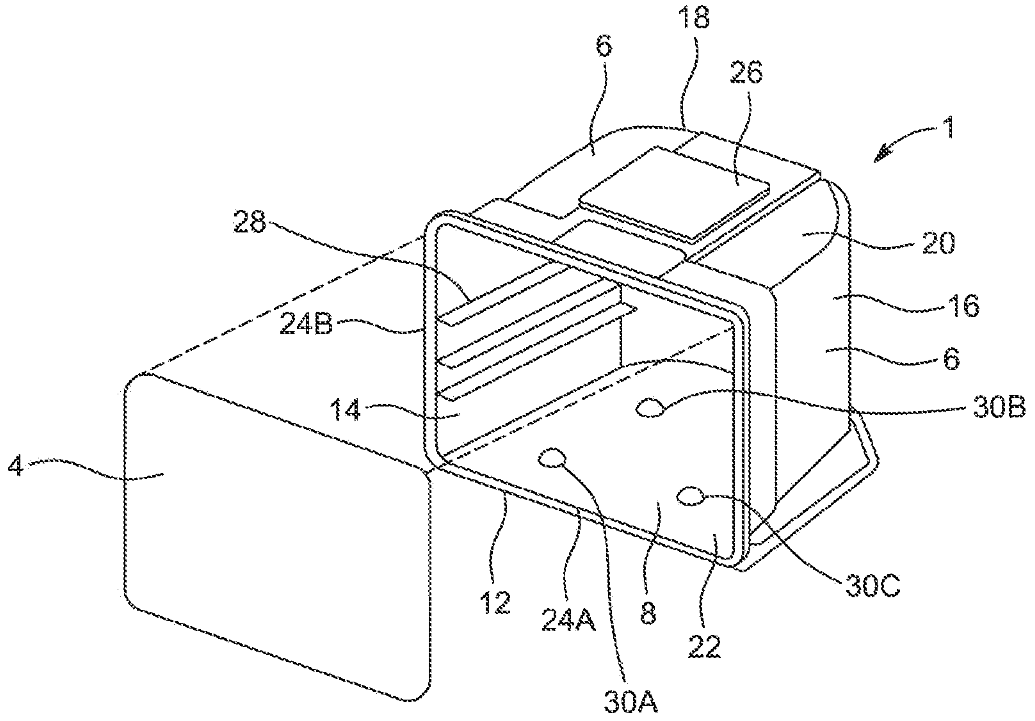
FIG. 2 is an exploded view of a substrate container, according to at least one example embodiment.

Substrates in the form of wafers can be processed to form semiconductor devices. A substrate container is a container for carrying the substrates during processing. The substrates can be stored within a substrate container before and during the different process steps. The substrate container is accessed through a front opening of the substrate container. The substrate container may be, for example, a front opening unified pod (FOUP). In an embodiment, the substrate container can be a container for a reticle, such as a reticle pod. In such an embodiment, the container body can be included as at least part of an outer pod configured to contain an inner pod, with the purge flow distribution system including flow distribution system base being configured to provide the purge gas to an interior space of the outer pod FIGS. 1-2 show a substrate container 1 according to an embodiment of the disclosure. FIG. 1 is a front perspective view of the substrate container 1, while FIG. 2 illustrates the substrate container with the door removed (e.g., opened). As shown in FIG. 1, the substrate container 1 includes a front door 4 and a shell 6. The front door 4 is received within a front opening 12 of the shell 6, blocking the front opening 12.

FIG. 2 illustrates the substrate container 1 with the front door 4 removed (e.g., opened). As shown in FIG. 2, the shell 6 defines the interior space 8 of the substrate container, in which substrates are stored in the interior space 8 of the substrate container 1. The substrate container 1 can be accessed by moving (e.g., opening, removing) the door 4. For example, the door 4 in FIG. 1 is received in the shell 6 by inserting the door 4 into the shell 6. In an embodiment, one or more of the door 4 and the shell 6 can include a locking mechanism (not shown) to prevent accidental removal of the door 4.

As further shown in FIG. 2, the shell 6 includes a first side wall 14, a second side wall 16, a rear wall 18, and a top wall 20, and a bottom wall 22. The first side wall 14 is opposite to the second side wall 16, and the top wall 20 is opposite the bottom wall 22. The first side wall 14 can be referred to as the left side while the second side wall 16 can be referred to as the right side. The top wall 20 and bottom wall 22 each extend between the first side wall 14 and the second side wall 16. The shell 6 includes a front edge extending between opposing walls. The bottom wall 22 includes a front edge 24A that extends along the front opening 12. The front edge 24A also extends between the first side wall 14 and the second side wall 16 of the shell 6. The first side wall 14 includes a front edge 24B that extends along the front opening 12. The front edge 24B of the first side wall 14 also extends between the top wall 20 and the bottom wall 22 of the shell 6. As shown in FIG. 2, the front edges 24A, 24B in an embodiment are each directly adjacent to the front opening 12.

The substrate container 1 can include an equipment hookup 26 on the top wall 20 of the shell 6. In an embodiment, the equipment hookup 26 allows a standard automated attachment (not shown) for moving the substrate container 1, such as but not limited to an automated arm, to be connected to the substrate container 1. For example, the automated arm may be used to move the substrate container 1 between different processing equipment. In an embodiment, the substrate container 1 may include one or more handles (not shown) to allow a user (e.g., a technician, etc.) to manually move the substrate container 1.

The substrate container 1 can include a plurality of shelves 28 for holding substrates (not shown) in the interior space 8. The portions of the shelves 28 on the second side wall 16 are obscured in FIG. 2, which have a similar configuration to the portions on the shelves 28 on the first side wall 14 (e.g., slots in the substrate container). The shelves 28 are sized to each hold a substrate (not shown) within the interior space 8. For example, the shelves 28 in an embodiment are sized to hold a specific size of substrate (e.g., 150 mm wafers, 200 mm wafers, etc.).

The substrate container 1 can include on the bottom wall 22, a plurality of inlet purge port(s) and/or outlet purge port(s) (e.g., 30A, 30B, 30C, etc. of FIG. 2) corresponding to inlet(s) and/or outlet(s) of the substrate container 1. The plurality of inlet purge port(s) (and outlet purge ports) can be connected to a purge flow distribution system, as further discussed below. The at least one outlet port can be provided for discharging gas in the interior space 8 out of the substrate container 1 and can be disposed in the bottom wall between the inlet and the second side wall. It is appreciated that the inlet purge port(s) and/or outlet purge port(s) can also be provided in different positions along the shell 6, e.g., in the rear wall 18, in which such embodiment, the inlet purge port and/or outlet purge port corresponds to the inlet and outlet of the substrate container.

The substrate container 1 also includes at least one inlet, e.g., inlet port, for receiving a stream of purge gas from a purge gas supply system. The purge gas supply system delivers purge gas which may generally be an inert gas. The purge gas can include, for example, but is not limited to, one or more of nitrogen, clean dry air (CDA), and extra clean dry air (xCDA).

In an embodiment, the inlet port is connected to the purge flow distribution system for supplying the purge gas to the inlet purge port(s) to distribute the purge gas into the interior space 8. When the substrate container 1 is open, the purge flow distribution system can be used to distribute the purge gas to the interior space 8 to reduce ingress of the external environment (e.g., gas, particles, humidity, etc.) through the front opening 12 into the substrate container 1. For example, the supplied purge gas is configured to flow out from interior space 8 through the front opening 12, which helps minimize any inward flows into the interior space 8 through the front opening 12.

Conversely, purge gas can continue to be supplied to the interior space 8 of the substrate container 1 when the door 4 is received within the front opening 12 and the substrate container 1 is closed. The purge gas can also be exhausted to the exterior of the substrate container 1 through the purge flow distribution system, such as described herein according to the various embodiments, which may serve as both an inlet and an outlet or as an outlet only depending on the configuration and desired application. A positive pressure of purge gas within the interior space 8 creates a diffusion gradient facilitating the flow of purge gas from the interior space through the one or more outlets and out of the substrate container.

Figure 3A:
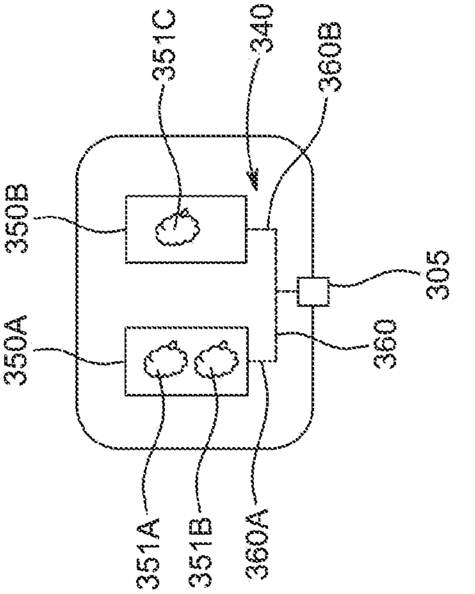
FIGS. 3A-3C are schematic views of a substrate container having a purge flow distribution system that is configured to divide the supply of purge gas, according to different embodiments.

FIG. 3A schematically shows an embodiment of the purge flow distribution system 340. The purge flow distribution system 340 is connected to the inlet port 305 to receive the purge gas from the purge supply system. The purge flow distribution system 340 further includes a network of separate gas distributing devices 350 for distributing the stream of purge gas into the interior space 8. A supply line 360 connected to the inlet is used to divide the stream of purge gas to the network of separate gas distributing devices 350. For example, in an embodiment, the supply line includes at least a first flow path 360A that is connected to a first gas distributing device 350A and at least a second flow path 360B that is connected to a second gas distributing device 350B. It is appreciated, however, that the supply line 360 can be separated into any number of different flow paths, as necessary, for the purging operation of the substrate container, e.g., an additional third, fourth, etc. flow path to supply the purge gas to separate and/or the same gas distributing device(s) in the substrate container 1. That is, the supply line 360 is configured to receive the supply of purge gas from a common input port, e.g., a purge gas source, and divide the supply of purge gas to a plurality of discrete input purge ports for supplying a plurality of gas distributing devices 350.

The network of separate gas distributing devices includes a plurality of separate and distinct gas distributing devices 350 that are connected together by the at least one supply line 360. Thus, the network of separate gas distributing devices includes the separate gas distributing devices 350 and the associated piping that connect(s) the separate distributing devices for the distribution of the purge gas flow to the interior of the substrate container 1.

The gas distributing devices 350 are devices that are separate and distinct devices from other gas distributing devices of the network, in which each gas distributing device includes at least one gas distributing surface, and is a combination of any of the plurality of gas distributing surface(s) 351A, 351B, 351C that are provided at certain specific locations in the substrate container, e.g., a front gas distributing device includes any and all of the gas distributing surfaces 351A, 351B provided at the front of the substrate container. That is, the gas distributing device(s) is the combination of any or all of a plurality of gas distributing surface(s) provided a specific location of the substrate container, in which the gas distributing surface is the structural part of the gas distributing device that distributes the portion of the purge gas from the gas distributing device into the interior space. It is appreciated that the gas distributing surface 351A, 351B, 351C is connected to at least one input purge port and includes structure(s) for distributing the purge gas into the interior space, for example, diffusers, manifolds, membranes, portions having slits or nozzles or is made of porous material, or similar structures that is able to direct the purge gas into the interior of the substrate container, and combinations of the same.

For example, in an embodiment, the first gas distributing device 350A is located at the rear section, e.g., nearer the rear wall 18, of the FOUP and can include at least one gas distributing surface(s) 351A, 351B, for example, a first and/or second diffuser, that is connected to at least one input purge port. The second gas distributing device 350B can be located at the front section, e.g., nearer the front opening 12, of the FOUP and can include at least one gas distributing surface(s) 351C that comprises a plurality of openings arranged along a length of the gas distributing surface between the first side wall and the second side wall or that extends vertically along one of a front edge of the first side wall or a front edge of the second side wall, e.g., a top/bottom manifold and/or a right/left manifold, that is connected to at least one other input purge port. The supply line 360 is divided into a first flow path 360A to supply at least a portion of the stream of purge gas to the input purge port for the first gas distributing device 350A and into a second flow path 360B to supply at least another portion of the stream of purge gas to the input purge port for the second gas distributing device 350B. It is appreciated that the first and second gas distributing devices are not necessarily located at the rear and front sections, but are provided by way of example, and can be provided at varying (or the same) locations in the interior space of the substrate container.

The amount of the purge gas supplied to the first and second flow paths 360A, 360B to supply the separate gas distributing devices 350A, 350B can be set in a number of ways. For example, in an embodiment, valves can be provided in the supply line and set, e.g., setting the valve to a predetermined opening size, to divide the supply of purge gas to the first and second flow paths 360A, 360B to supply a predetermined amount of purge gas to the separate gas distributing devices 350A, 350B. The valves can include needle valves, ball valves, butterfly valves, non-return valves, or similarly structured valves that are used to set the amount of flow of purge gas to the different and separate gas distributing devices. It is appreciated that the amount of purge gas can also be set using an orifice, spring loaded diverter, or having one of the first or second flow paths have piping/pipes that have smaller or larger cross-sectional areas, as needed, to divide the supply of purge gas to the appropriate/predetermined amount to supply the gas distributing device(s), e.g., the dividing/supplying of the purge gas is based on differential pressure of the network. It is also appreciated that amount of purge gas can be set to each separate gas distributing surface 351A, 351B, 351C. In other words, the supply of purge gas from a single inlet port is divided and set so that the predetermined amount of purge gas is supplied to the plurality of discrete input purge ports for supplying the gas distributing devices and/or gas distributing surfaces, respectively.

Figure 3C:
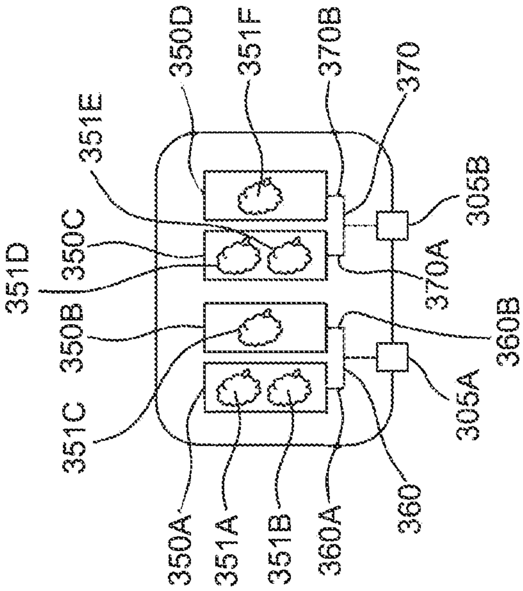
Figure 3B:
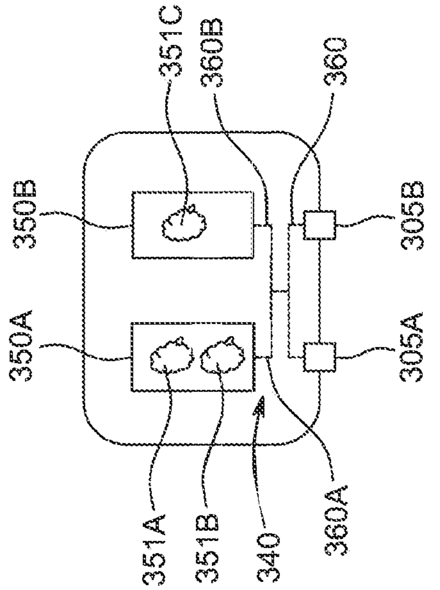

FIG. 3B illustrates another embodiment of the purge flow distribution system 340, in which the inlet includes at least two inlet ports 305A and 305B. In the embodiment of FIG. 3B, the purge flow distribution system 340 is connected to both inlet ports 305A, 305B to receive the purge gas from the purge gas supply system. The purge flow distribution system further includes a network of separate gas distributing devices 350 for distributing the purge gas into the interior of the interior space 8. The supply line 360, however, in this embodiment is connected to both inlet ports 305A and 305B so that the supply of purge gas is combined and then divided into at least a first flow path 360A connected to a first gas distributing device 350A and a second flow path 360B that is connected to a second gas distributing device 350B. It is appreciated that the supply of purge gas can be mixed/combined from the joining of the piping of the supply line from the inlet ports 305A, 305B, or mixed, e.g., using an in-line mixer, and then divided/separated into the different flow paths 360A, 360B. The first and second gas distributing devices 350A, 350B each include at least one gas distributing surface for distributing the purge gas into the interior of the substrate container, as discussed above.

The amount of the purge gas supplied to the first and second flow paths 360A, 360B to supply the separate gas distributing devices 350A, 350B can be set in a number of ways. For example, in an embodiment, valves can be provided upstream and/or downstream of the mixing/combining of the supply of purge gas from the inlet ports 305A, 305B and set to divide the supply of purge gas into the predetermined amount of purge gas for the separate gas distributing devices 350A, 350B and/or the separate gas distributing surfaces 351A, 351B, 351C. In other words, the supply of purge gas from both inlet ports 305A, 305B is divided and set so that the predetermined amount of purge gas is supplied to the plurality of discrete input purge ports for supplying the separate gas distributing devices and/or separate gas distributing surfaces, respectively.

FIG. 3C illustrates yet another embodiment of the purge flow distribution system 340, in which the inlet includes at least two inlet ports 305A and 305B, where the inlet ports are separately used to supply different networks of separate gas distributing devices. That is, the purge flow distribution system 340 includes at least two networks of separate gas distributing devices 350 for distributing the stream of purge gas into the interior space 8. In this embodiment, the purge flow distribution system 340 includes at least two separate supply lines 360, 370 that are each connected separately to the inlet ports 305A and 305B. The first supply line 360 connected to inlet port 305A is used to divide the supply of purge gas from inlet port 305A into at least a first flow path 360A connected to a first gas distributing device 350A having gas distributing surfaces 351A, 351B and a second flow path 360B that is connected to a second gas distributing device 350B having at least one gas distributing surface 351C. The second supply line 370 connected to inlet port 305B is used to divide the supply of purge gas from the inlet port 305B into at least a first flow path 370A connected to a third gas distributing device 350C having at least two gas distributing surfaces 351D, 351E and a second flow path 370B connected to a fourth gas distributing device 350D having at least one gas distributing surface 351F.

The amount of the purge gas supplied to the first and second flow paths of the at least two networks of separate gas distributing devices to supply the separate gas distributing devices 350A, 350B, 350C, 350D can be set in a number of ways. For example, in an embodiment, valves can be provided in the supply lines 360, 370 and set to divide the supply of purge gas into the predetermined amount of purge gas for the separate gas distributing devices 350A, 350B, 350C, 350D and/or the separate gas distributing surfaces 351A, 351B, 351C, 351D, 351E, 351F. In other words, the supply of purge gas from the inlet ports 305A, 305B are each used separately to supply a respective supply line, where each respective supply line is used to divide and set the predetermined amount of purge gas to be supplied to the plurality of discrete input purge ports for supplying the separate gas distributing devices.

It is appreciated that while FIGS. 3A-3C show that the supply line 360 (or 370) is divided prior to supplying the separate gas distributing devices, the supply line can be separated to any number of different flow paths that can be used to supply purge gas separately to any of the gas distributing devices and/or the gas distributing surfaces, as long as the predetermined amount of purge gas flow can be set to be divided and/or distributed to the respective gas distributing device, e.g., equal amount of flow of purge gas to all of the gas distributing devices in the network or more flow of purge gas to one of the gas distributing devices, as necessary. It is also appreciated that the inlet ports can be provided at different locations along the substrate container. For example, the bottom wall of the substrate container can include a rear inlet port for introducing the second stream of purge gas, in which the rear inlet port is disposed nearer the rear wall than the front opening or the bottom wall can include a second inlet port for introducing a second stream of purge gas, in which the second inlet port is disposed nearer the front opening than the rear wall, or other location along the substrate container. In other embodiments, the inlet port(s) (and/or outlet port) can be provided on the bottom wall of the substrate container in which if multiple inlet ports are provided, the purge gas can be combined before the purge gas is supplied to the purge flow distribution system.

While the foregoing has been described with respect to a FOUP, it is appreciated that any of the embodiments discussed herein can also be used to distribute purge gas in an interior space within a reticle pod, for example, within an outer pod of a reticle pod.

Figure 4A:
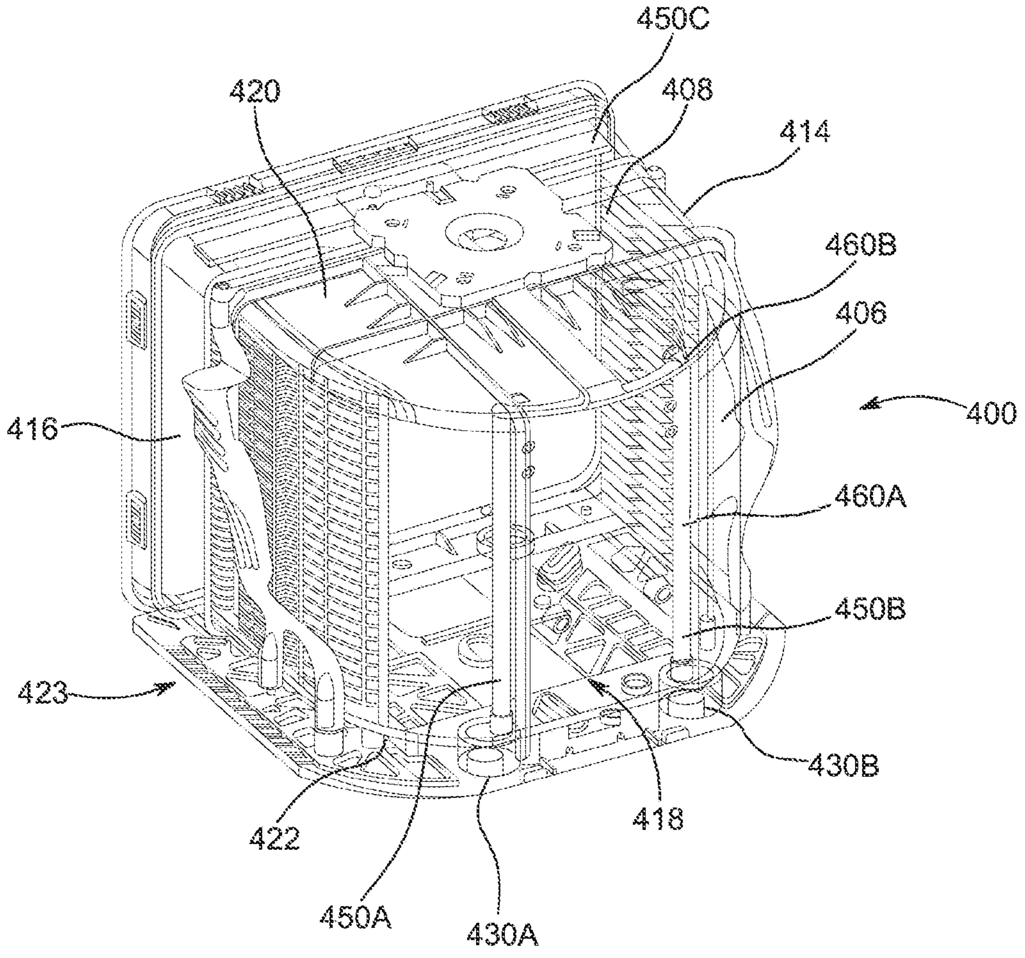
FIG. 4A is a rear prospective view of a substrate container having a purge flow distribution system that is configured to divide the supply of purge gas, according to at least one example embodiment.
Figure 4B:
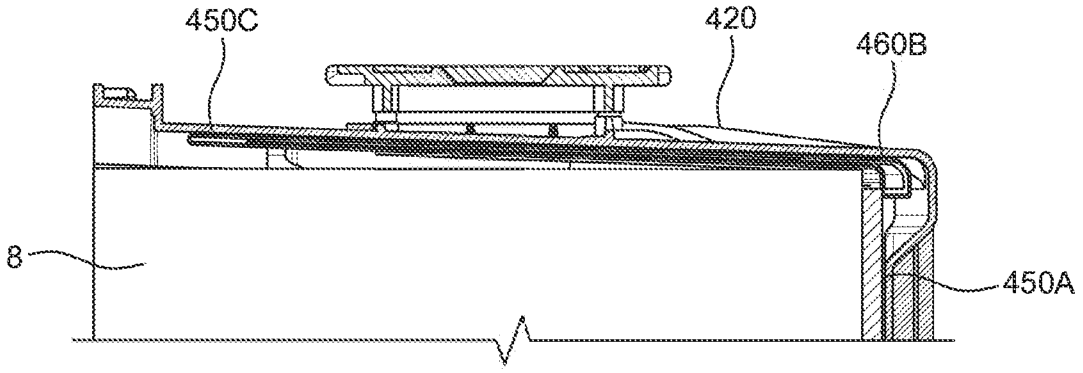
FIG. 4B is a top side sectional view of the substrate container of FIG. 4A, according to at least one example embodiment.

For example, FIGS. 4A and 4B illustrate another embodiment in which the supply line can be provided for dividing the supply of purge gas to the separate gas distributing device(s) and/or separate gas distributing surface(s). In the embodiment, the second flow path of the supply line is provided after the first flow path.

FIG. 4A shows the rear side of substrate container 400. The shell 406 defines the interior space 408 of the substrate container, in which substrates (not shown) are stored in the interior space 408 of the substrate container 400. The shell 406 includes a first side wall 414, a second side wall 416, a rear wall 418, and a top wall 420, and a bottom wall 422. The first side wall 414 is opposite to the second side wall 416, and the top wall 420 is opposite the bottom wall 422. The first side wall 414 can be referred to as the left side while the second side wall 416 can be referred to as the right side. The top wall 420 and bottom wall 422 each extend between the first side wall 414 and the second side wall 416. The substrate container 400 can also include a carrier plate 423 which can provide a base that the shell 406 can be attached to.

The purge flow distribution system can be included in the shell 406 of the substrate container 400 or connected thereto, for example, between or at least partially disposed between the shell 406 and carrier plate 423. The purge flow distribution system is connected to at least one inlet port that is connected to a purge gas supply system for supplying the purge gas to the network of separate gas distributing devices. The purge flow distribution system includes at least one supply line that is connected to at least one inlet purge port 430A, 430B on the bottom wall 422. The supply line includes a first flow path 460A connected to the inlet purge ports 430A, 430B for supplying purge gas to the rear gas distributing devices 450A, 450B, in which the rear gas distributing devices can include at least two diffusers. The at least two diffusers 450A, 450B include a plurality of openings for distributing the purge gas at the rear of the substrate container 400. At least one of the at least two diffusers 450A, 450B of the rear gas distributing device also includes an opening at a top end thereof that is nearer the top wall 420 of the substrate container 400 forming an input purge port that is connected to a second flow path 460B for supplying the purge gas to another gas distributing device, e.g., a second gas distributing device. In this embodiment, the second flow path 460B is connected to a front gas distributing device that includes at least one gas distributing surface, for example, a top manifold 450C provided near the top wall 420 of the substrate container 400.

As seen in FIG. 4B, the second flow path 460B includes a tubing, channel, or path provided along a top portion nearer the top wall 420 of the substrate container 400 for supplying at least a portion of the purge gas supplied to the first flow path 460A to be distributed to the front gas distributing device. For example, the amount of purge gas to the front gas distributing device can be set by sizing the cross-sectional area of the second flow path 460B to have a predetermined amount of purge gas flow, e.g., in which flow is proportional to the cross-sectional area, and/or by setting the size, e.g., diameter, of the plurality of openings of the at least two diffusers 450A, 450B so that a predetermined amount of purge gas is supplied through the second flow path 460B dependent on the supply pressure, e.g., pressure differential. That is, the first gas distributing device is supplied with the purge gas to distribute a predetermined amount of purge gas through the openings of the diffusers 450A, 450B, while the remaining amount of purge gas is supplied to the second gas distributing device via the second flow path 460B for distributing the purge gas through the gas distributing surface(s) of the second (front) gas distributing device. It is appreciated that any of the gas distributing surfaces, while described herein relate to a top manifold and diffusers, can be any of the structures for distributing the purge gas into the interior of the substrate container 400, including, but not limited to, top/bottom/side manifold(s), top/bottom/side diffusers, top/bottom/side membranes, top/bottom/side portions having slits or nozzles or made of porous material. It is also appreciated that the supply line can also include valves or other structures for setting the amount of purge gas supplied to the first gas distributing device and/or the second gas distributing device.

Figure 5A:
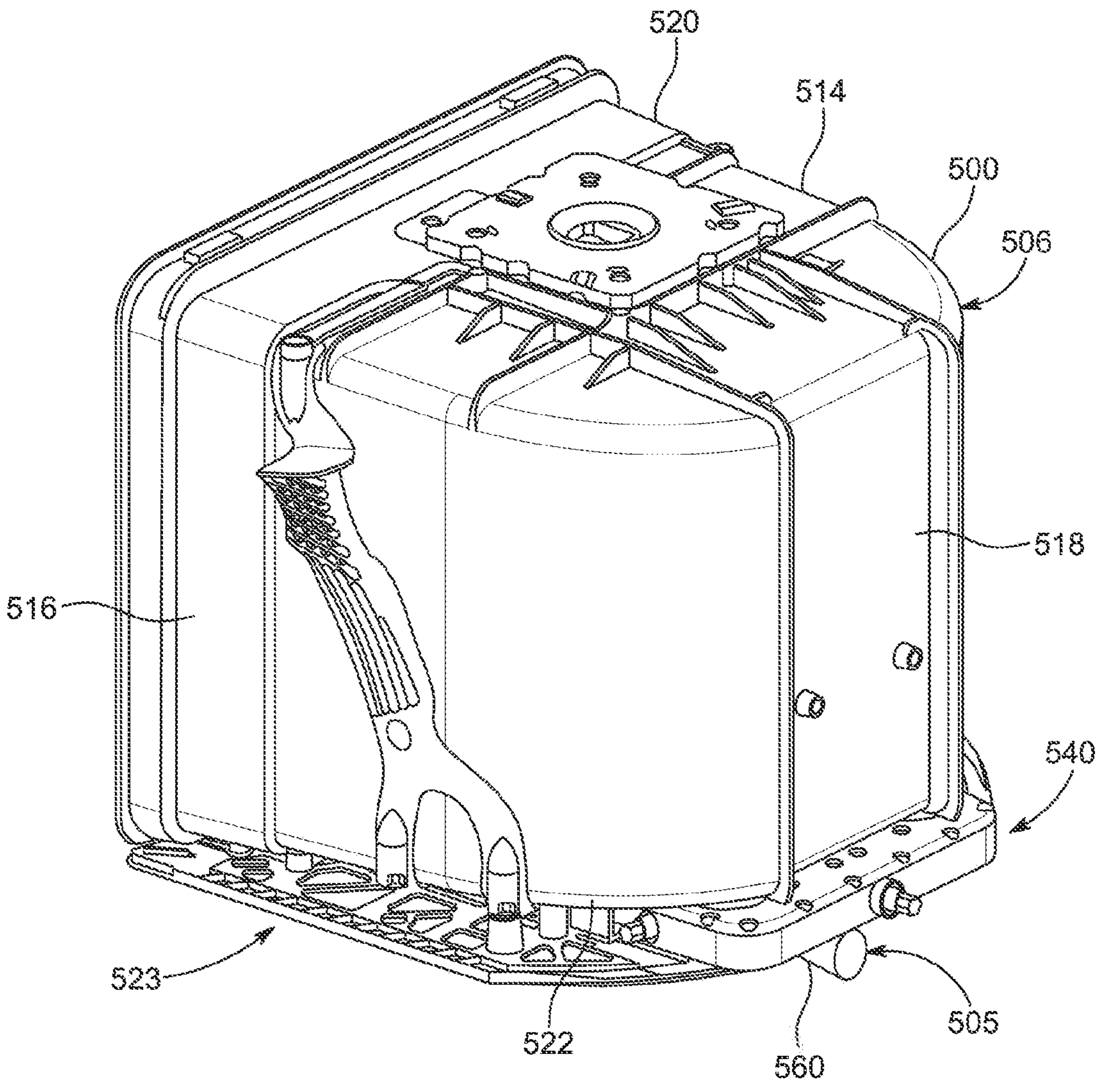
FIG. 5A is a rear prospective view of a substrate container having a purge flow distribution system that is configured to divide the supply of purge gas using a manifold base, according to at least one example embodiment.

FIG. 5A illustrates another embodiment and shows the rear side of substrate container 500. The shell 506 defines the interior space of the substrate container, in which substrates (not shown) are stored in the interior space of the substrate container 500. The shell 506 includes a first side wall 514, a second side wall 516, a rear wall 518, and a top wall 520, and a bottom wall 522. The first side wall 514 is opposite to the second side wall 516, and the top wall 520 is opposite the bottom wall 522. The first side wall 514 can be referred to as the left side while the second side wall 516 can be referred to as the right side. The top wall 520 and bottom wall 522 each extend between the first side wall 514 and the second side wall 516. The substrate container 500 can also include a carrier plate 523 which can provide a base that the shell 506 can be attached to.

The purge flow distribution system can be included in the shell 506 of the substrate container 500 or connected thereto, for example, between or at least partially disposed between the shell 506 and carrier plate 523. The purge flow distribution system 540 is connected to at least one inlet port 505 that is connected to a purge gas supply system for supplying the purge gas to the network of separate gas distributing devices. The purge flow distribution system 540 includes at least one supply line that is connected to at least one purge port on the bottom wall 522. In this embodiment, the purge flow distribution system 540 includes a manifold base 560 provided on the bottom wall 522 that is configured to divide the stream of purge gas to the network of gas distributing devices.

Figure 5B:
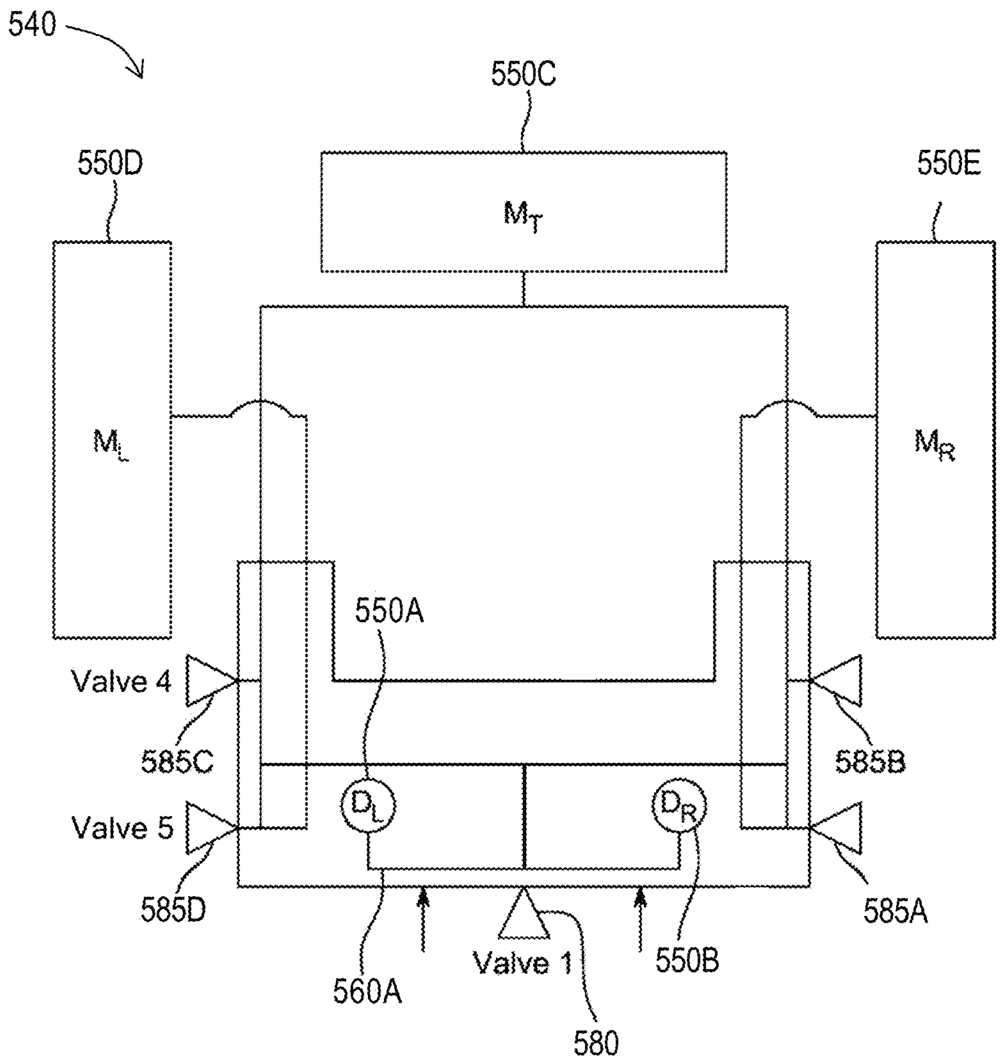
FIG. 5B is a schematic view of the manifold base of FIG. 5A that is configured to divide the supply of purge gas, according to different embodiments

As seen in FIG. 5B, the manifold base 560 is connected to the network of separate gas distributing devices 550. The manifold base 560 includes a first flow path 560A connected to inlet purge port(s) for supplying purge gas to a first gas distributing device and a second flow path 560B connected to inlet purge port(s) for supplying purge gas to a second gas distributing device. The first gas distributing device can be a rear gas distributing device 550A that can include rear left and right diffusers 550A and 550B and the second gas distributing device can be a front gas distributing device that can include a front manifold 550C and left and right manifolds 550D and 550E for distributing the purge gas to the interior of the substrate container at a front side of the substrate container. The purge flow distribution system 540 is configured in a way such that the supply line can be adjusted to set the amount of purge gas that flows to at least one of the front gas distributing device and the rear gas distributing device, and/or can also be set to adjust the amount of purge gas to the separate gas distributing surfaces of the front gas distributing device and/or the rear gas distributing device. It is appreciated that the first and second gas distributing devices are not necessarily located at the rear and front sections, but are provided by way of example, and can be provided at varying (or the same) locations in the interior space of the substrate container.

For example, in this embodiment, an inlet supply line valve 580 can be adjusted to set the amount of purge gas supplied to the front gas distributing device and the rear gas distributing device. That is, by adjusting the supply line valve 580 a pressure differential can be created to divide the supply of purge gas to the first flow path 560A and the second flow path 560B to set the amount of purge gas supplied to the front gas distributing device and the rear gas distributing device that is necessary for the purging of the substrate container.

In addition to controlling the amount of purge gas to the front gas distributing device by setting the supply line valve 580, the amount of purge gas to the separate gas distributing surfaces 550C, 550D, 550E of the front gas distributing device can be adjusted using a plurality of adjustable valves 585A, 585B, 585C, 585D. For example, adjustable valve 585A can be set to control an amount of purge gas to the front right, e.g., right side, manifold 550E, adjustable valves 585B and 585C can be set to control an amount of purge gas to the front manifold 550C, and adjustable valve 585D can be set to control an amount of purge gas to the front left, e.g., left side, manifold 550D. Thus, the manifold base 560 can be used to divide the purge gas from the supply line to the network of separate gas distributing devices and/or the separate gas distributing surfaces by setting the adjustable valves 580, 585A, 585B, 585C, 585D. In other words, the supply of purge gas from a single inlet port is divided and set so that the predetermined amount of purge gas is supplied to the plurality of discrete input purge ports for supplying the separate gas distributing devices 550, respectively.

Figure 5C:
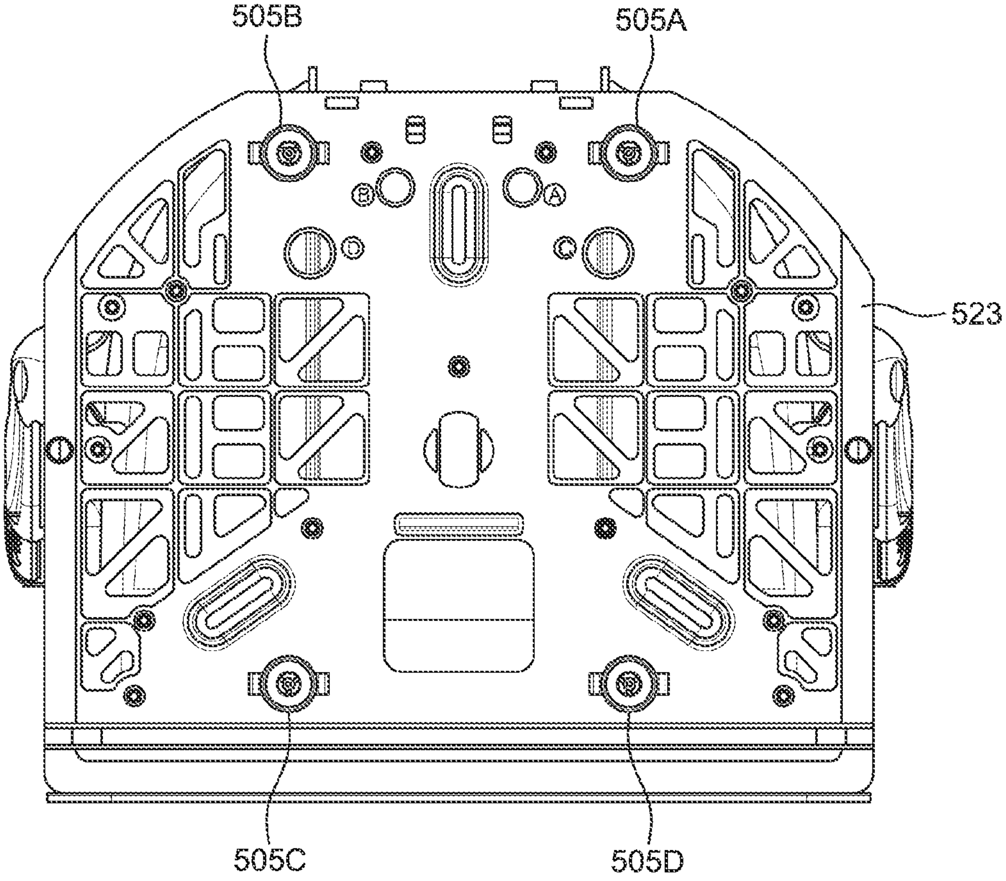
FIG. 5C is a bottom side view of the substrate container of FIG. 5A, according to at least one example embodiment.

As seen in FIG. 5C, the inlet port(s) connected to the purge flow distribution system 540 can be provided in a variety of locations. For example, while FIG. 5A generally shows that the inlet port 505 is provided below the manifold base 560 for supplying the purge gas from the purge gas distribution system, it is appreciated that the purge gas can be supplied to a number of inlet port(s) (or outlet port(s)) 505A, 505B, 505C, 505D provided through the carrier plate 523 depending on the nature of the application/docking arrangement for the substrate container. It is appreciated that the purge gas from the inlet ports 505A, 505B, 505C, 505D can be combined before being supplied to manifold base 560 or provided/combined as necessary to supply different purge flow distribution systems in the substrate container.

It is appreciated that the amount of purge gas can also be controlled or set using any combination of different structures that allow setting the pressure drop or flow rate based on the conservation of energy. For example, an orifice can be placed in either the first flow path and/or the second flow path to create a pressure differential to set the amount of purge gas supplied to the front gas distributing device and/or the rear gas distributing device and/or any of the separate gas distributing surfaces. Alternatively, or in addition to such structure, the cross-sectional area of the various piping(s) of the first flow path and/or the second flow path can be sized to set the amount of purge gas divided between the front gas distributing device and the rear gas distributing device and/or the gas distributing surfaces of the front and rear gas distributing devices. Thus, the purge flow distribution system 540 is configured so that the purge gas can be divided and supplied to the different gas distributing devices and/or gas distributing surfaces by adjusting and/or setting the different components of the purge flow distribution system 540 in the appropriate manner.

Figure 6:
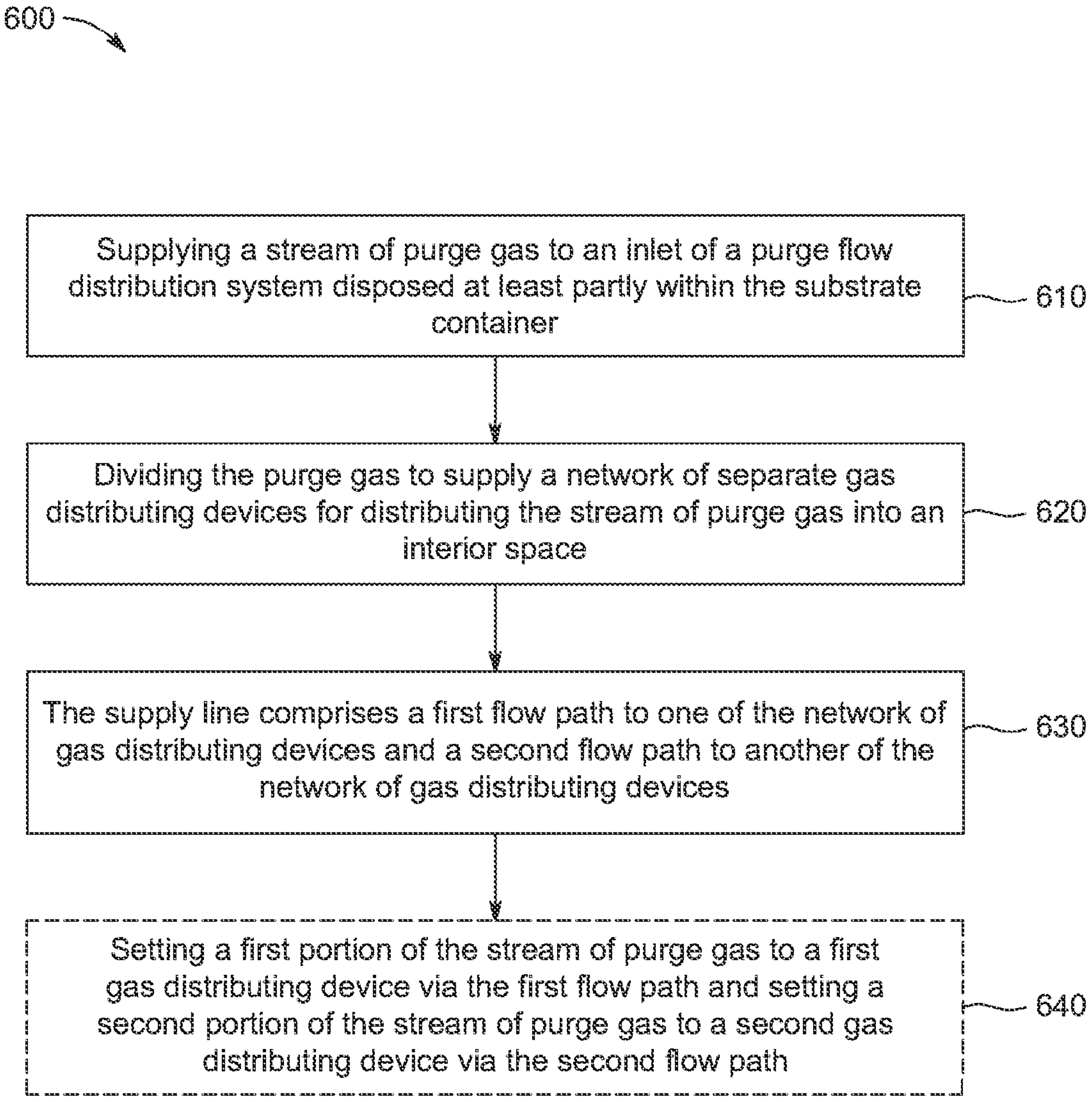
FIG. 6 is a flow diagram for a method of purging a substrate container that includes dividing the supply of purge gas to a network of separate gas distributing devices, according to at least one example embodiment.

FIG. 6 shows an operational flow 600 for supplying purge flow to a substrate container, according to at least one example embodiment.

The operational flow 600 may include one or more operations, actions, or functions depicted by one or more blocks 610, 620, 630, and 640. Although illustrated as discrete blocks, various blocks may be divided into additional blocks, combined into fewer blocks, or eliminated, depending on the desired implementation. As a non-limiting example, the description of the method 600, corresponding to the depiction thereof in FIG. 6 and performed by one or more of the apparatuses or components described in the above embodiments, according to one or more example embodiments described herein, pertains to supplying purge flow in a substrate container. The processing flow 600 can begin at block 610.

Block 610 may refer to supplying a stream of purge gas into an interior of a container via inlet purge port(s) connected to a purge flow distribution system disposed at least partly in the substrate container, which may be a wafer or reticle container (e.g., a FOUP or reticle pod). The stream of purge gas can include one or more of nitrogen, clean dry air (CDA), extra clean dry air (xCDA), gas for conditioning a container environment, or any other suitable fluid. Block 610 may be followed by block 620.

Block 620 may refer to dividing the purge gas to supply a network of separate gas distributing devices to distribute the stream of purge gas into the interior space of the substrate container via a supply line of the purge flow distribution system. In an embodiment in block 630, the dividing of the purge gas includes splitting the supply line into a first flow path to supply purge gas to at least one of the network of gas distributing devices and a second flow path to supply purge gas to another of the network of gas distributing devices. The amount of purge gas supplied to the first flow path and to the second flow path can be based on a number of predetermined operating conditions. For example, in one embodiment, one or more sensors can be used to detect at least one environmental condition in the interior of the substrate container during a predetermined period of time. The at least one environmental condition may include one or more of relative humidity (% RH), pressure (e.g., absolute pressure), oxygen levels, temperature, a measured presence of airborne molecular contaminant, a measured presence of one or more volatile organic compounds, etc. Block 620/630 may be followed by block 640.

Block 640 may refer to setting a first portion or amount of the stream of purge gas to a first distributing device via the first flow path and setting a second portion or amount of the purge gas to a second gas distributing device via the second flow path based on the at least one detected environmental condition during a predetermined period of time.

In at least one example embodiment, the amount of purge gas to the front gas distributing device and/or the rear gas distributing device may be obtained or determined by, e.g., achieving a desired (predetermined, or optimal) environmental response (e.g., inside the container). The desired environmental response may include adjusting one or more of relative humidity (% RH), oxygen levels, temperature, a measured presence of airborne molecular contaminant, and/or a measured presence of one or more volatile organic compounds in the interior of the container to a respective predetermined threshold level. The desired environmental response may also include producing a desired pressure (e.g., absolute pressure) in the interior of the container. The environmental response may be detected or measured by sensor(s) inside the container and the detected data may be communicated to outside of the container, e.g., a controller.

The controller analyzes the environmental response(s) and determines the amount of purge gas to be supplied to the front gas distributing device (and/or the front gas distributing surfaces) and the rear gas distributing device necessary to reach applicable operational scenarios. In an embodiment, the controller analyzing the environmental response(s) and determining the amount of purge gas to reach applicable operational scenarios may be achieved via design of experiments (DOEs), a trained neural network, modeling, etc.

The amount of purge gas supplied to the at least one front distributing device and/or the rear distributing device can be set by setting valve(s) provided in the supply line of the purge flow distribution system. The valves can include needle valves, ball valves, butterfly valves, non-return valves, or similarly structured valves that can be used to control the flow of gas to the different and separate gas distributing devices. It is appreciated that the flow of purge gas can also be set using an orifice, spring loaded diverter, or by sizing the piping/pipes of one of the first or second flow paths to have cross-sectional areas to supply a predetermined amount of purge gas given the supply pressure for the division of the supply of purge gas, as necessary. In an embodiment, once the amount of purge gas supplied to the network of gas distributing devices is set, the amount, e.g., valves, of purge gas supplied is not further adjusted until necessary, e.g., passive control.

Aspects

Any of aspects 1-17 can be combined with any of aspects 18 and 19.

Aspect 1. A substrate container, comprising: a shell defining an interior space, the shell including a front opening, a first side wall, a second side wall, a rear wall, and a bottom wall including a front edge extending between the first side wall and the second side wall along the front opening of the shell; and a purge flow distribution system configured to receive a stream of purge gas, the purge flow distribution system comprising: an inlet configured to receive the stream of purge gas; and a network of separate gas distributing devices for distributing the stream of purge gas into the interior space, wherein the purge flow distribution system further comprises a supply line connected to the inlet that is configured to divide the stream of purge gas to the network of separate gas distributing devices.

Aspect 2. The substrate container of aspect 1, wherein the supply line comprises a first flow path to one of the network of separate gas distributing devices and a second flow path to another of the network of separate gas distributing devices.

Aspect 3. The substrate container of aspect 2, wherein the one of the network of gas distributing devices is a first gas distributing device provided nearer the rear wall and the another of the network of gas distributing devices is a second gas distributing device provided in the interior space of the substrate container, and wherein the first flow path is configured to supply a portion of the stream of purge gas to the first gas distributing device and the second flow path is configured to supply another portion of the stream of purge gas to the second gas distributing device.

Aspect 4. The substrate container of aspect 3, wherein the first flow path of the supply line to the first gas distributing device has a smaller or larger cross-sectional area than the second flow path of the supply line to the second gas distributing device or comprises an orifice, a spring loaded diverter, or valve to induce flow to the second flow path of the supply line to the second gas distributing device.

Aspect 5. The substrate container of aspect 3, wherein the second flow path is provided after the first flow path at an end of the first gas distributing device opposite the inlet.

Aspect 6. The substrate container of aspect 6, wherein the second flow path is provided at a top portion of the substrate container to supply the purge gas to the second gas distributing device.

Aspect 7. The substrate container of aspect 6, wherein the second gas distributing device comprises a gas distributing surface that comprises a plurality of openings arranged along a length of the gas distributing surface between the first side wall and the second side wall or wherein the front gas distributing device comprises a gas distributing surface that extends vertically along one of a front edge of the first side wall or a front edge of the second side wall.

Aspect 8. The substrate container of any of aspects 1-3, wherein the purge flow distribution system further comprises a manifold base provided on the bottom wall that receives the stream of purge gas from the inlet to divide the stream of purge gas to the network of gas distributing device.

Aspect 9. The substrate container of aspect 8, wherein the manifold base is configured to divide the second flow path into at least a left side second flow path and a right side second flow path to supply the portion of the stream of purge gas to the second gas distributing device.

Aspect 10. The substrate container of aspect 9, wherein the manifold base comprises a plurality of adjustable valves to set at least one of the portion of the stream of purge gas to the first flow path to the first gas distributing device and the portion of stream of purge gas to the second flow path to the second gas distributing device.

Aspect 11. The substrate container of any of aspects 1-9, wherein one of the network of gas distributing devices comprises a gas distributing surface comprising porous material.

Aspect 12. The substrate container of any of aspects 1-11, wherein the purge flow distribution system is attached to an inlet purge port in the bottom wall of the shell.

Aspect 13. The substrate container of any of aspects 1-12, wherein one of the network of gas distributing devices includes a gas distributing surface that comprises a plurality of openings arranged along a length of the gas distributing surface between the first side wall and the second side wall of the shell.

Aspect 14. The substrate container of any of aspects 1-13, further comprising: an outlet port for discharging gas from the interior space, the outlet port being disposed in the bottom wall between the inlet and the second side wall.

Aspect 15. The substrate container of any of aspects 1-14, wherein the bottom wall includes a rear inlet port for introducing a second stream of purge gas into the interior space through the purge flow distribution system, the rear inlet port being disposed nearer the rear wall than the front opening.

Aspect 16. The substrate container of any of aspects 1-14, wherein the bottom wall includes a second inlet port for introducing a second stream of purge gas into the interior space through the purge flow distribution system, the second inlet port being disposed nearer the front opening than the rear wall.

Aspect 17. The substrate container of any of aspects 1-16, further comprising: a door configured to be received within the front opening defined by the shell to enclose the interior space.

Aspect 18. The substrate container of any of aspects 1-17, wherein the inlet of the purge flow distribution system comprises a first inlet and a second inlet, wherein the supply line is configured to combine the stream of purge gas from the first inlet and the second inlet and then divide the stream of purge gas to the network of separate gas distributing devices.

Aspect 19. A method of purging a substrate container that is open, comprising: supplying, via an inlet port disposed in a wall of the substrate container, a stream of purge gas to an inlet of a purge flow distribution system disposed at least partly within the substrate container; dividing, via a supply line of the purge flow distribution system, the purge gas to supply a network of separate gas distributing devices for distributing the stream of purge gas into an interior space of the substrate container, wherein the supply line comprises a first flow path to one of the network of gas distributing devices and a second flow path to another of the network of gas distributing devices.

Aspect 20. The method of aspect 19, further comprising setting a first portion of the stream of purge gas to a first gas distributing device via the first flow path and setting a second portion of the stream of purge gas to a second gas distributing device via the second flow path

Having thus described several illustrative embodiments of the present disclosure, those of skill in the art will readily appreciate that yet other embodiments may be made and used within the scope of the claims hereto attached. Numerous advantages of the disclosure covered by this document have been set forth in the foregoing description. It will be understood, however, that this disclosure is, in many respect, only illustrative. Changes may be made in the details, particularly in matters of shape, size, and arrangement of parts without exceeding the scope of the disclosure. The disclosure's scope is, of course, defined in the language in which the appended claims are expressed.

What is claimed is:

1. A substrate container, comprising:

a shell defining an interior space, the shell including a front opening, a first side wall, a second side wall, a rear wall, and a bottom wall including a front edge extending between the first side wall and the second side wall along the front opening of the shell; and a purge flow distribution system configured to receive a stream of purge gas, the purge flow distribution system comprising:

an inlet configured to receive the stream of purge gas; and a network of separate gas distributing devices for distributing the stream of purge gas into the interior space, wherein the purge flow distribution system further comprises a supply line connected to the inlet that is configured to divide the stream of purge gas to the network of separate gas distributing devices, and wherein the purge flow distribution system is attached to an inlet purge port in the bottom wall of the shell.

2. The substrate container according to claim 1, wherein the supply line comprises a first flow path to one of the network of separate gas distributing devices and a second flow path to another of the network of separate gas distributing devices.

3. The substrate container according to claim 2, wherein the one of the network of gas distributing devices is a first gas distributing device provided nearer the rear wall and the another of the network of gas distributing devices is a second gas distributing device provided in the interior space of the substrate container, and wherein the first flow path is configured to supply a portion of the stream of purge gas to the first gas distributing device and the second flow path is configured to supply another portion of the stream of purge gas to the second gas distributing device.

4. The substrate container according to claim 3, wherein the first flow path of the supply line to the first gas distributing device has a smaller or larger cross-sectional area than the second flow path of the supply line to the second gas distributing device or comprises an orifice, a spring loaded diverter, or valve to induce flow to the second flow path of the supply line to the front gas distributing device.

5. The substrate container according to claim 3, wherein the second flow path is provided after the first flow path at an end of the first gas distributing device opposite the inlet.

6. The substrate container according to claim 5, wherein the second flow path is provided at a top portion of the substrate container to supply the purge gas to the second gas distributing device.

7. The substrate container according to claim 6, wherein the second gas distributing device comprises a gas distributing surface that comprises a plurality of openings arranged along a length of the gas distributing surface between the first side wall and the second side wall or wherein the front gas distributing device comprises a gas distributing surface that extends vertically along one of a front edge of the first side wall or a front edge of the second side wall.

8. The substrate container according to claim 3, wherein the purge flow distribution system further comprises a manifold base provided on the bottom wall that receives the stream of purge gas from the inlet to divide the stream of purge gas to the network of gas distributing device.

9. The substrate container according to claim 8, wherein the manifold base is configured to divide the second flow path into at least a left side second flow path and a right side second flow path to supply the portion of the stream of purge gas to the second gas distributing device.

10. The substrate container according to claim 9, wherein the manifold base comprises a plurality of adjustable valves to set at least one of the portion of the stream of purge gas to the first flow path to the first gas distributing device and the portion of stream of purge gas to the second flow path to the second gas distributing device.

11. The substrate container according to claim 1, wherein one of the network of gas distributing devices comprises a gas distributing surface comprising porous material.

12. The substrate container of claim 1, wherein one of the network of gas distributing devices includes a gas distributing surface that comprises a plurality of openings arranged along a length of the gas distributing surface between the first side wall and the second side wall of the shell.

13. The substrate container of claim 1, further comprising:
an outlet port for discharging gas from the interior space, the outlet port being disposed in the bottom wall between the inlet and the second side wall.

14. The substrate container of claim 1, wherein
the bottom wall includes a rear inlet port for introducing a second stream of purge gas into the interior space through the purge flow distribution system, the rear inlet port being disposed nearer the rear wall than the front opening.

15. The substrate container of claim 1, wherein
the bottom wall includes a second inlet port for introducing a second stream of purge gas into the interior space through the purge flow distribution system, the second inlet port being disposed nearer the front opening than the rear wall.

16. The substrate container of claim 1, further comprising:
a door configured to be received within the front opening defined by the shell to enclose the interior space.

17. The substrate container of claim 1, wherein the inlet of the purge flow distribution system comprises a first inlet and a second inlet, wherein the supply line is configured to combine the stream of purge gas from the first inlet and the second inlet and then divide the stream of purge gas to the network of separate gas distributing devices.

* * * * *